(12) United States Patent
Tsukimura

(10) Patent No.: US 9,054,005 B2
(45) Date of Patent: Jun. 9, 2015

(54) SEMICONDUCTOR DEVICE, IMAGING DEVICE, METHOD OF INSPECTING SEMICONDUCTOR SUBSTRATE, AND METHOD OF FABRICATING SEMICONDUCTOR DEVICE

(71) Applicant: OLYMPUS CORPORATION, Tokyo (JP)

(72) Inventor: Mitsuhiro Tsukimura, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 14/059,156

(22) Filed: Oct. 21, 2013

(65) Prior Publication Data

US 2014/0110811 A1    Apr. 24, 2014

(30) Foreign Application Priority Data

Oct. 24, 2012   (JP) ................. 2012-234955

(51) Int. Cl.
| | |
|---|---|
| *H01L 27/146* | (2006.01) |
| *H01L 25/00* | (2006.01) |
| *H01L 21/66* | (2006.01) |
| *H01L 23/00* | (2006.01) |
| *H01L 25/065* | (2006.01) |

(52) U.S. Cl.
CPC .......... *H01L 27/14636* (2013.01); *H01L 22/14* (2013.01); *H01L 25/00* (2013.01); *H01L 27/14634* (2013.01); *H01L 24/05* (2013.01); *H01L 24/08* (2013.01); *H01L 24/94* (2013.01); *H01L 25/0657* (2013.01); *H01L 2224/05644* (2013.01); *H01L 2224/08146* (2013.01); *H01L 2224/94* (2013.01); *H01L 2225/06596* (2013.01); *H01L 2225/06541* (2013.01); *H01L 27/14618* (2013.01); *H01L 22/20* (2013.01); *H01L 22/32* (2013.01); *H01L 2224/02166* (2013.01); *H01L 2224/05554* (2013.01)

(58) Field of Classification Search
CPC .......... H01L 22/14; H01L 25/00; H01L 25/50; H01L 27/14634; H01L 27/14636
USPC ............ 257/390, 443, 777, E27.133; 438/17, 438/128
See application file for complete search history.

(56) References Cited

U.S. PATENT DOCUMENTS

| | | | |
|---|---|---|---|
| 2007/0015315 A1* | 1/2007 | Shiraishi et al. | ............. 438/113 |
| 2012/0248580 A1* | 10/2012 | Matsugai et al. | ............. 257/621 |

FOREIGN PATENT DOCUMENTS

| | | |
|---|---|---|
| JP | 4349232 B2 | 10/2009 |
| JP | 2010-219339 A | 9/2010 |

* cited by examiner

*Primary Examiner* — Fernando L Toledo
*Assistant Examiner* — Adam S Bowen
(74) *Attorney, Agent, or Firm* — Westerman, Hattori, Daniels & Adrian, LLP

(57) ABSTRACT

A semiconductor device includes a first semiconductor substrate and a second semiconductor substrate. The first semiconductor substrate and the second semiconductor substrate are electrically connected to each other in a state in which a first connection surface of the first semiconductor substrate and a second connection surface of the second semiconductor substrate face each other. A concave portion is formed in at least one of the first connection surface and the second connection surface. An electrode, which is electrically connected to a portion of wirings included in a wiring layer provided in the first semiconductor substrate or the second semiconductor substrate in which the concave portion is formed and is capable of being electrically connected to an outside, is formed in an inside of the concave portion.

10 Claims, 13 Drawing Sheets

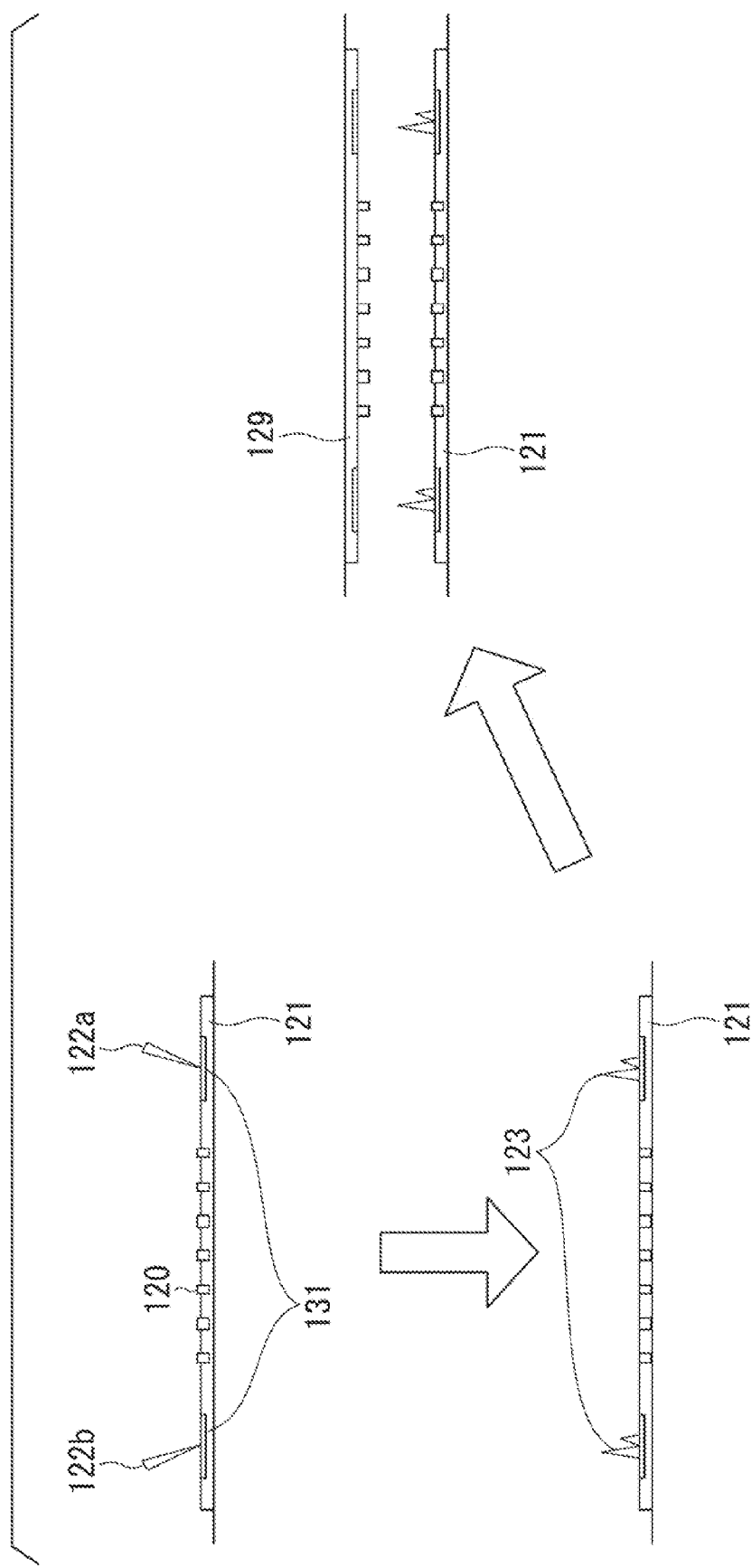

SEMICONDUCTOR DEVICE, IMAGING DEVICE, METHOD OF INSPECTING SEMICONDUCTOR SUBSTRATE, AND METHOD OF FABRICATING SEMICONDUCTOR DEVICE

BACKGROUND OF THE INVENTION

1. Field of the Invention

The present invention relates to a semiconductor device, an imaging device, a method of inspecting a semiconductor substrate, and a method of fabricating a semiconductor device.

Priority is claimed on Japanese Patent Application No. 2012-234955, filed Oct. 24, 2012, the content of which is incorporated herein by reference.

2. Description of Related Art

In general, video cameras, electronic still cameras, and the like have been widely used. In these cameras, charge-coupled device (CCD) type or amplification type solid-state image sensors have been used. In the amplification type solid-state image sensors, signal charges generated and accumulated in a photoelectric converter of a light-receiving pixel are led to an amplification unit provided in the pixel. The amplification unit outputs an amplified signal from the pixel. In the amplification type solid-state image sensor, such a pixel is arranged in plural in a matrix form. As the amplification type solid-state image sensor, for example, there is a complementary metal oxide semiconductor (CMOS) type solid-state image sensor using a CMOS transistor.

In the related art, in a general CMOS type solid-state image sensor, a method of sequentially reading out signal charges generated and accumulated in a photoelectric converter of each pixel arranged in a two-dimensional (2D) matrix form in units of pixel rows is employed. At this time, since an exposure timing in the photoelectric converter of each pixel is determined in accordance with start and stop of read-out of the signal charges, the exposure timings for each pixel are different. Therefore, when a fast moving subject is imaged using the CMOS type solid-state image sensor, the subject is distorted and imaged.

To eliminate the distortion of the subject, a simultaneous imaging function (a global shutter function) which realizes simultaneity of accumulation of the signal charges is suggested. Further, the use of the CMOS type solid-state image sensor having the global shutter function is increasing. In the CMOS type solid-state image sensor having the global shutter function, conventionally, in order to accumulate the signal charges generated in the photoelectric converter until the signal charges are read out, it is necessary to have a storage capacitor having a light-shielding property. In such a CMOS type solid-state image sensor in the related art, after all the pixels are simultaneously exposed, the signal charges generated in the photoelectric converters of all the pixels are simultaneously transferred to the storage capacitors and first accumulated. The signal charges are sequentially converted into pixel signals at a predetermined read-out timing.

However, in the CMOS type solid-state image sensor having the global shutter function in the related art, the photoelectric converter and the storage capacitor have to be formed on the same plane of a substrate. Thus, in the CMOS type solid-state image sensor, a wafer area, which is an area which a solid-state image sensor occupies on a wafer in which the solid-state image sensor is formed, is inevitably increased. Further, during a stand-by period until the signal charges accumulated in the storage capacitor are read out, there is a problem that signal quality is deteriorated by noise due to leakage of light or storage capacitance.

To solve the problem, for example, in Japanese Patent Publication No. 4349232, a solid-state image sensor including a back-illuminated type MOS image sensor wafer and a signal-processing wafer mutually connected by a micro bump is disclosed. In the MOS image sensor wafer, a micro pad is formed in a wiring layer side every unit pixel. In the signal-processing wafer, a micro pad is formed in a wiring layer side at a location corresponding to the micro pad of the MOS image sensor wafer. Further, for example, in Japanese Unexamined Patent Application, First Publication No. 2010-219339, a method is disclosed for preventing an increase in a wafer area by a solid-state image sensor in which a first substrate formed with a photoelectric converter and a second substrate formed with a plurality of MOS transistors are bonded.

A process of inspecting an operation of each wafer is performed before the MOS image sensor wafer and the signal-processing wafer are connected by the micro bump (hereinafter, referred to as a bump) and the like. Improvement in yield is promoted by fabricating the image sensor by connection of the wafers whose operation is to be checked in the inspection process. The inspection is performed by pressing a probe needle to an electrode formed on a wafer surface.

SUMMARY OF THE INVENTION

According to a first aspect of the present invention, a semiconductor device includes a first semiconductor substrate having a first wiring layer in which wirings are disposed in a plurality of layers, and a second semiconductor substrate having a second wiring layer in which wirings are disposed in a plurality of layers. In a state in which a first connection surface of the first semiconductor substrate and a second connection surface of the second semiconductor substrate face each other, the first semiconductor substrate and the second semiconductor substrate are electrically connected to each other. A concave portion is formed in at least one of the first connection surface and the second connection surface. An electrode, which is electrically connected to a portion of a wiring included in the wiring layer included in the first semiconductor substrate or the second semiconductor substrate in which the concave portion is formed, and is capable of being electrically connected to an outside, is formed in an inside of the concave portion.

According to a second aspect of the present invention, in the semiconductor device according to the first aspect, the at least one of the first semiconductor substrate and the second semiconductor substrate may have the concave portion in both a first surface, which is the first or second connection surface, and a second surface, which is opposite to the first surface.

According to a third aspect of the present invention, in the semiconductor device according to the second aspect, in a case in which the first surface and the second surface have the concave portion, an opening range of the concave portion of the first surface in a two-dimensional plane parallel to both the first semiconductor substrate and the second semiconductor substrate may at least partially overlap an opening range of the concave portion of the second surface in the two-dimensional plane. At least a portion of the inside of the concave portion may be filled with filler.

According to a fourth aspect of the present invention, in the semiconductor device according to the third aspect, the at least one of the first semiconductor substrate and the second semiconductor substrate may be inspected before the first semiconductor substrate and the second semiconductor substrate are electrically connected to each other. After the at least one of the first semiconductor substrate and the second semiconductor substrate that is a target semiconductor substrate in which the filler is to be filled is inspected, the filler may be filled in the semiconductor substrate before the first semiconductor substrate and the second semiconductor substrate are electrically connected to each other.

According to a fifth aspect of the present invention, in the semiconductor device according to any one of the first aspect to the fourth aspect, the first semiconductor substrate or the second semiconductor substrate may have the concave portion in a first surface, which is the first or second connection surface, and a second surface, which is opposite to the first surface. The concave portion of the first surface may be formed in a different horizontal location from the concave portion of the second surface. A first electrode formed in the inside of the concave portion of the first surface may be electrically connected to a wiring to which a second electrode formed in the inside of the concave portion of the second surface is connected.

According to a sixth aspect of the present invention, in the semiconductor device according to any one of the first aspect to the fourth aspect, the first semiconductor substrate or the second semiconductor substrate may have the concave portion in a first surface, which is the first or second connection surface, and a second surface, which is opposite to the first surface. A first electrode formed in the inside of the concave portion of the first surface may be electrically connected to a wiring of a different layer from a wiring to which a second electrode formed in the inside of the concave portion of the second surface is connected. The wiring to which the first electrode is connected and the wiring to which the second electrode is connected may be electrically connected to each other.

According to a seventh aspect of the present invention, in the semiconductor device according to any one of the first aspect to the sixth aspect, at least a pixel array may be formed in the first semiconductor substrate. At least a logic circuit configured to read out a signal acquired by the pixel array may be formed in the second substrate.

According to an eighth aspect of the present invention, an imaging device may include the semiconductor device according to the seventh aspect as an imaging unit configured to image a subject.

According to a ninth aspect of the present invention, a method of inspecting a semiconductor substrate, which is used for inspecting a first semiconductor substrate, which has a first wiring layer in which wirings are disposed in a plurality of layers, used in a semiconductor device in which the first semiconductor substrate and a second semiconductor substrate are electrically connected to each other in a state in which a first connection surface of the first semiconductor substrate and a second connection surface of the second semiconductor substrate face each other, includes a process of inspecting the first semiconductor substrate in which the first connection surface has a concave portion which has an electrode electrically connected to a portion of a wiring included in the first wiring layer and capable of being electrically connected to an outside in an inside thereof, using an electrical signal acquired using a probe needle from the electrode.

According to a tenth aspect of the present invention, a method of fabricating a semiconductor device includes: a process of forming a concave portion, which has an electrode which is electrically connected to a portion of wirings of a first semiconductor substrate and is capable of being electrically connected to an outside therein, in a first connection surface, which is connected to a second semiconductor substrate, of at least the first semiconductor substrate of the first semiconductor substrate having a first wiring layer in which the wirings are disposed in a plurality of layers and the second semiconductor substrate having a second wiring layer in which wirings are disposed in a plurality of layers; a process of inspecting at least the first semiconductor substrate in which the concave portion is formed using an electrical signal acquired using a probe needle from the electrode in an inside of the concave portion in a wafer state; and a process of electrically connecting the first semiconductor substrate and the second semiconductor substrate to each other in a state in which the first connection surface of the first semiconductor substrate and a second connection surface of the second semiconductor substrate face each other.

BRIEF DESCRIPTION OF THE DRAWINGS

FIG. 13 is a view for describing inspection of a semiconductor wafer.

DETAILED DESCRIPTION OF THE INVENTION

First Embodiment

Figure 1:
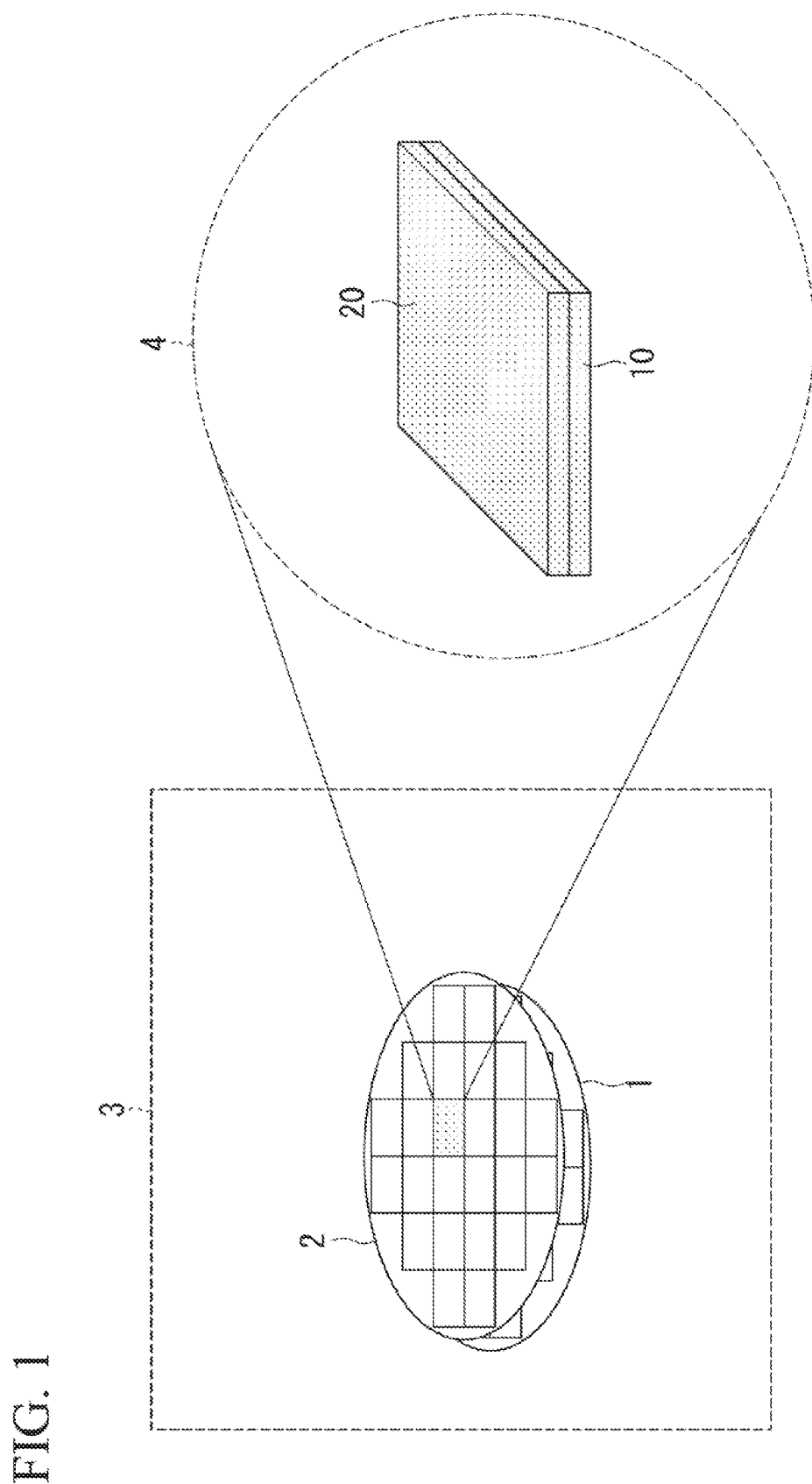
FIG. 1 is a schematic view of a semiconductor device according to a first embodiment of the present invention.

Hereinafter, a semiconductor device according to a first embodiment of the present invention is described with reference to the accompanying drawings. FIG. 1 is a schematic view of a semiconductor device 4 according to the present embodiment. In FIG. 1, a connection wafer 3 in which a first semiconductor wafer 1 and a second semiconductor wafer 2 are stacked and electrically connected is illustrated. In the connection wafer 3, a plurality of semiconductor devices 4 are included. The first semiconductor wafer 1 and the second semiconductor wafer 2 are electrically connected to each other by connection pads (connection parts) included in each of the first semiconductor wafer and the second semiconductor wafer in a state in which a wiring layer side of the first semiconductor wafer 1 and a wiring layer side of the second semiconductor wafer 2 face each other, thereby forming the connection wafer 3 including a plurality of semiconductor devices.

The semiconductor device 4 illustrated on the right of FIG. 1 is an enlarged version of one of the semiconductor devices included in the connection wafer 3. In the semiconductor device 4, a surface of a first semiconductor substrate 10 and a surface of a second semiconductor substrate 20 are electrically connected to each other by connection pads included in each of the first semiconductor substrate 10 and the second semiconductor substrate 20.

For example, the first semiconductor substrate 10 has a pixel group configured of a photoelectric conversion element and a transistor. The photoelectric conversion element in the pixel group converts detected light into an electrical signal to acquire an imaging signal. For example, the second semiconductor substrate 20 has a read-out circuit configured to read out the imaging signal acquired in the pixel group. The read-out circuit reads out the imaging signal through connection pads 21 (see FIGS. 2 and 4) to be described later. Thus, the read-out circuit of the second semiconductor substrate 20 can read out the imaging signal acquired in the pixel group of the first semiconductor substrate 10. Thereby, the semiconductor device 4 functions as an image sensor.

Figure 2:
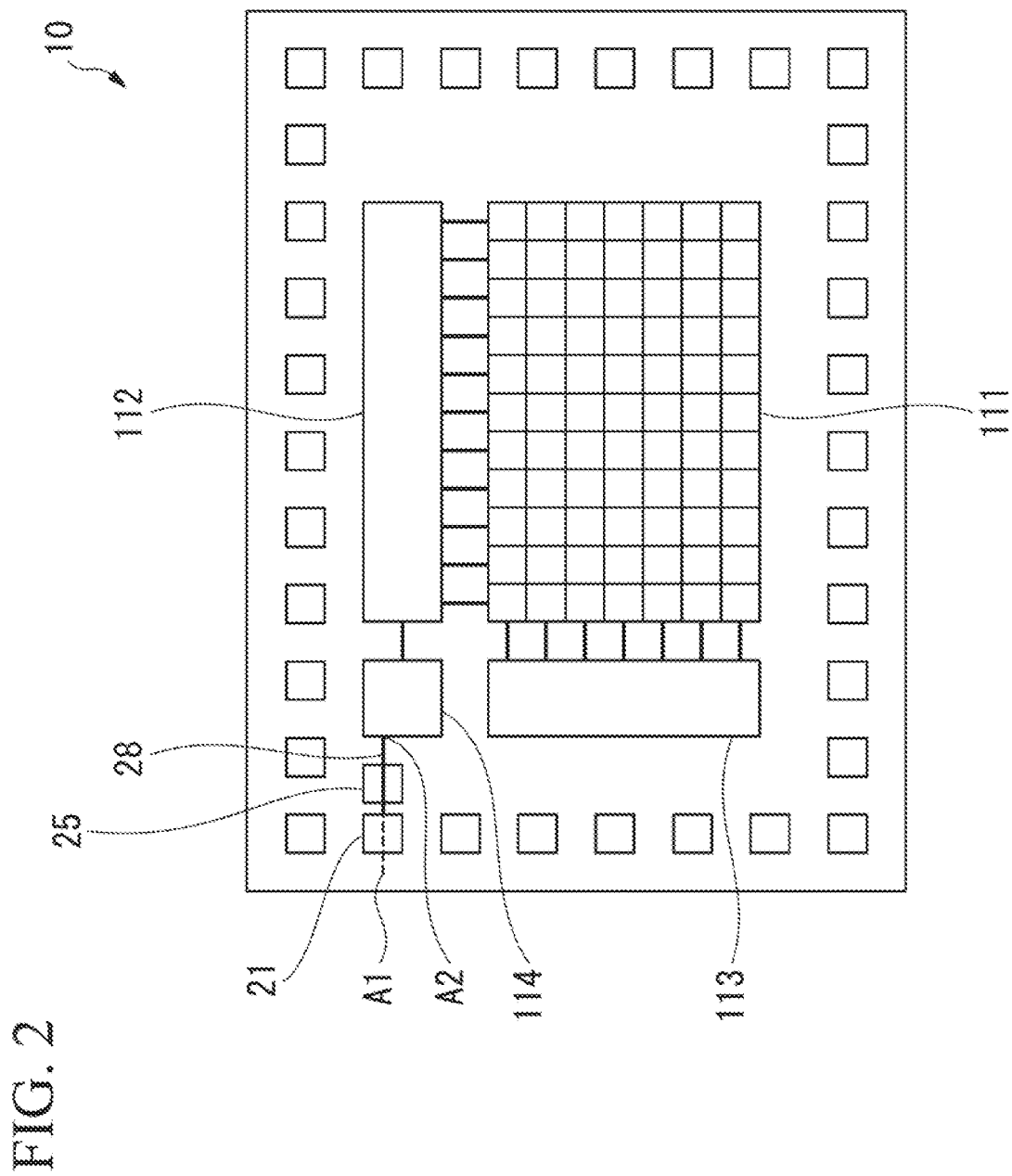
FIG. 2 is an example of a plan view of a first semiconductor substrate of the semiconductor device according to the first embodiment of the present invention.

FIG. 2 is an example of a plan view of the first semiconductor substrate 10. In FIG. 2, the first semiconductor substrate 10 includes a pixel region 111, a horizontal scanning circuit 112, a vertical scanning circuit 113, an amplifier circuit 114, a first wiring 28, a plurality of connection pads 21, and a first opening (a concave portion) 25. The horizontal scanning circuit 112, the vertical scanning circuit 113, and the amplifier circuit 114 are provided for inspection of the pixel region 111, and the circuits 112, 113, and 114 are separate circuits from the read-out circuit of the second semiconductor substrate 20.

The pixel region 111 includes, for example, a plurality of pixels. Each of the pixels includes, for example, a photodiode. The photodiode generates an imaging signal by converting detected light into an electrical signal.

The vertical scanning circuit 113 is a circuit for reading out the electrical signal after conversion in the photodiode every row of the pixel region 111. The horizontal scanning circuit 112 is a circuit for reading out the electrical signal after conversion in the photodiode every column of the pixel region 111. The horizontal scanning circuit 112 assumes, for example, that the vertical scanning circuit 113 is outputting a read-out signal at a high level for a target row that is a target in the pixel region 111. At this time, for example, the horizontal scanning circuit 112 sequentially supplies the read-out signal at the high level from a photodiode in the left column to a photodiode in the right column for only a predetermined time. Thus, an electrical signal corresponding to one photodiode is sequentially read out. When the read-out processing is completed with respect to all photodiodes in the target row of the pixel region 111, the same processing is repeatedly performed with respect to a row next to the target row. In this way, whenever the read-out for each row of the pixel region 111 is completed, the read-out processing for the next row is repeatedly performed to read out the converted electrical signals from all photodiodes. Thus, the horizontal scanning circuit 112 outputs the converted electrical signals which are sequentially read out as a time-series signal to the amplifier circuit 114.

The amplifier circuit 114 amplifies the time-series signal input from the horizontal scanning circuit 112. The amplifier circuit 114 outputs the amplified signal to the connection pads 21 through the first wiring 28. The plurality of connection pads 21 are electrically connected to pads 132 illustrated in FIG. 3 to be described later.

Figure 4:
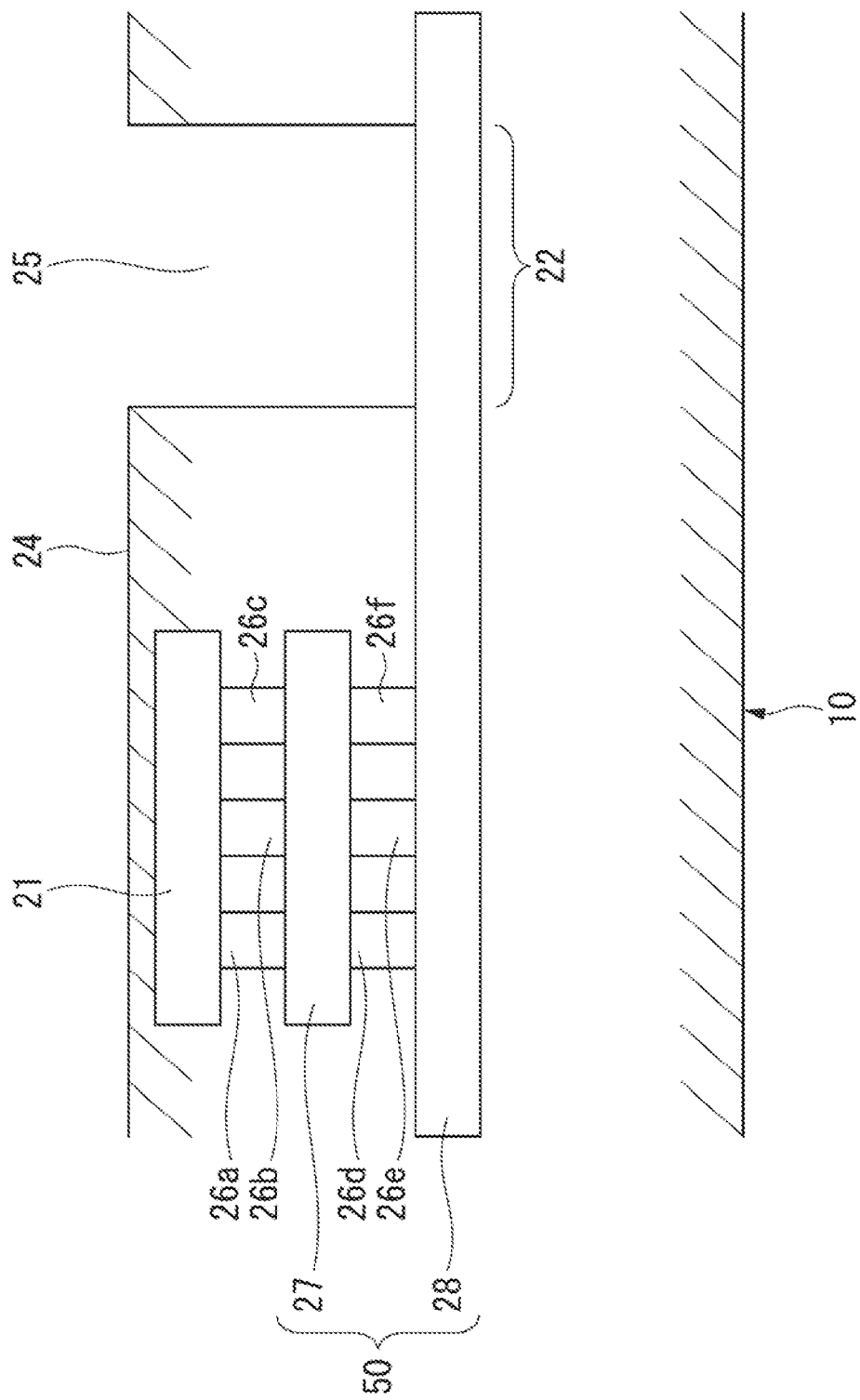
FIG. 4 is a cross-sectional view between A1 and A2 of FIG. 2.

To expose an inspection electrode 22 as illustrated in FIG. 4 to be described later, the first opening (the concave portion) 25 is a groove (or a recess) formed in the first semiconductor substrate 10. For example, a shape of the first opening 25 is a square shape in a plane of the first semiconductor substrate. The shape of the first opening 25 in the plane of the first semiconductor substrate is not limited to the square shape and may be a tetragonal shape other than the square shape (for example, a rectangular shape, a parallelogram, a diamond shape), a polygonal shape (for example, a triangular shape, a hexagonal shape, an octagonal shape), a circular shape, or an elliptical shape. A location of the first opening 25 is not limited to a location illustrated in FIG. 2. For example, the first opening 25 may be located in any location on the first wiring 28.

Figure 3:
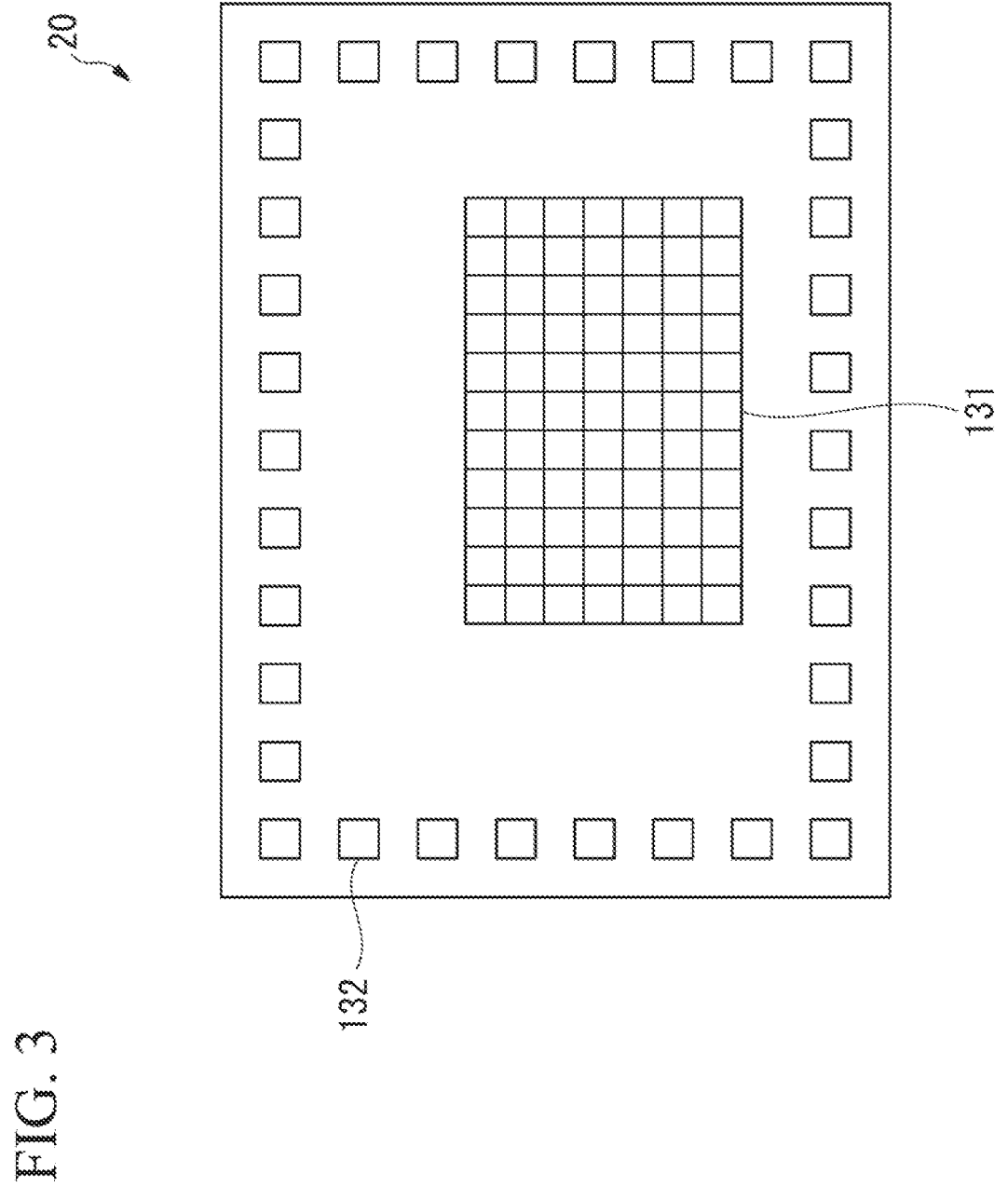
FIG. 3 is an example of a plan view of a second semiconductor substrate of the semiconductor device according to the first embodiment of the present invention.

FIG. 3 is an example of a plan view of the second semiconductor substrate 20. The second semiconductor substrate 20 includes a read-out circuit 131 and a plurality of pads 132. The read-out circuit 131 reads out the imaging signal acquired in each pixel of the pixel region illustrated in FIG. 2. The plurality of pads 132 are electrically connected to the connection pads 21 illustrated in FIG. 2, respectively.

The example of a cross-sectional view of the inspection electrode 22 of the first semiconductor substrate 10 used in probe inspection is described. FIG. 4 is a cross-sectional view between A1 and A2 of FIG. 2. The first semiconductor substrate 10 has a wiring layer (a first wiring layer) 50. For example, in the first semiconductor substrate 10, the wiring layer 50 has a first wiring 28 and a second wiring 27. The second wiring 27 is disposed in a different layer from the first wiring 28. In a side of the connection surface (a first connection surface or a first surface) 24 of the first semiconductor substrate 10, which is connected to the second semiconductor substrate 20 (not shown), the connection pad 21 which is a connection part electrically connected to the second semiconductor substrate 20 is disposed. The connection pad 21 is connected to the second wiring 27 in the first semiconductor substrate 10 through three vias 26a to 26c. Here, each of vias 26a to 26f is formed of, for example, a conductive metal. A height of each of the vias 26a to 26f is, for example, 0.5 μm.

Figure 5:
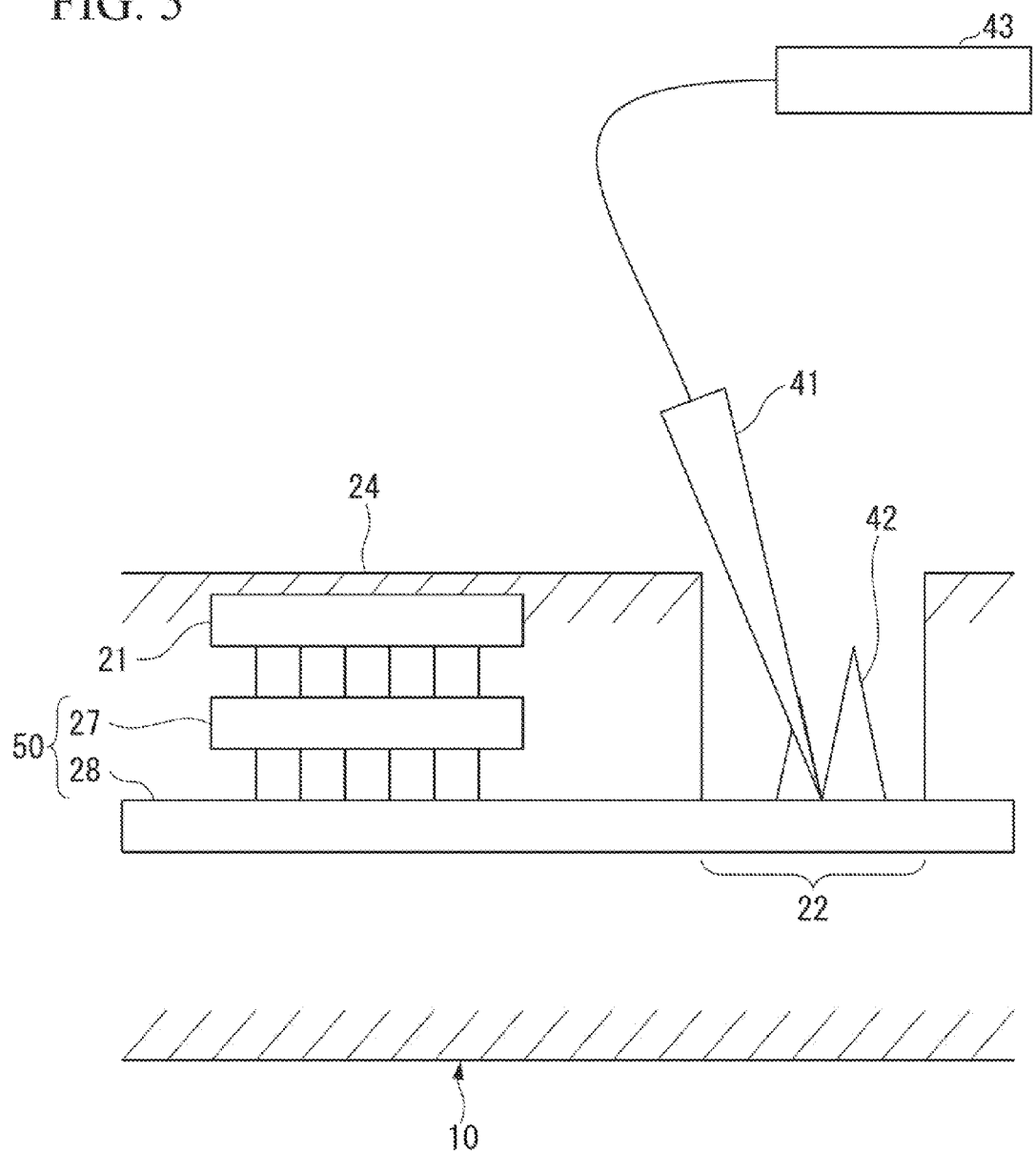
FIG. 5 is a view for describing a needle impression when a probe needle is pressed into an inspection electrode.

The second wiring 27 is connected to the first wiring 28 in the first semiconductor substrate 10 through three vias 26d to 26f. As illustrated in FIG. 5 to be described later, the inspection electrode (first electrode) 22 is provided in the first semiconductor substrate 10 to inspect the first semiconductor substrate 10 using a probe needle 41. The first wiring 28 extends to form the inspection electrode 22. To expose the inspection electrode 22, the first opening 25 is provided in the first semiconductor substrate 10. The first opening 25 is opened from the side of the connection surface 24 by performing an etching process. The first opening 25 has a concave cross-sectional shape formed by the connection surface 24 and the inspection electrode 22.

A depth of the first opening 25 is, for example, several micrometers. A surface of a side in which the inspection electrode 22 is exposed may be disposed in at least an inner side of the first semiconductor substrate 10 rather than the connection surface 24. A lateral width of the first opening 25 may be dozens of micrometers when viewed in cross-section. A size of opening of the first opening 25 may be a size in which the probe needle 41 can enter the opening so that the probe needle 41 is in contact with the inspection electrode 22. An inner wall of the first opening 25 may not be perpendicular to the connection surface 24. The inner wall of the first opening 25 may be formed in a stepped shape or a sloped shape. The inner wall of the first opening 25 may have a curvature.

As an example, in the semiconductor device 4 according to the present embodiment, a portion of the first wiring 28 functions as the inspection electrode 22. However, the inspection electrode 22 may be formed as a separate structure from the first wiring 28, and the first wiring 28 and the inspection electrode 22 may be connected by a wiring.

As an example, in the semiconductor device 4 according to the present embodiment, a manufacturer forms an opening exposing an electrode configured to receive a voltage provided from a power source and an opening exposing an electrode configured to input an electrical signal supplied from a pulse generator to the first semiconductor substrate 10, in the first semiconductor substrate 10 other than the first opening 25. In this way, for example, the electrodes formed in the openings receive the voltage or the electrical signal (for example, a clock signal for driving the horizontal scanning circuit 112 and the vertical scanning circuit 113) supplied from the power source or a pulse generator, respectively, through another probe needle. When a location of the first semiconductor substrate 10, to which the probe needle 41 is pressed to input a voltage or an input signal, is not in a range in which the first semiconductor substrate 10 is connected to the second substrate 20, there is no case in which the connection electrodes (connection pads) included in the respective wafers are not physically connected by the impression, and thus the above-described opening (the concave portion) may not be formed in the first semiconductor substrate 10.

FIG. 5 is a view for describing a needle impression 42 when the probe needle 41 is pressed to the inspection electrode 22. In FIG. 5, the needle impression 42 when the probe needle 41 is pressed to the inspection electrode 22 is illustrated. As shown in FIG. 5, since the needle impression 42 does not protrude from the connection surface 24, when the wafers are connected, connection electrodes included in the respective wafers can be physically connected without a gap. That is, it is possible to prevent a failure in which the connection electrodes (not shown) are not electrically connected when the wafers are connected.

In FIG. 5, for example, the probe needle 41 outputs an electrical signal detected from the inspection electrode 22 to an oscilloscope 43. The oscilloscope 43 displays a waveform of the electrical signal detected by the probe needle 41. Accordingly, the manufacturer can check whether or not an operation of the first semiconductor substrate 10 is normal by observing the waveform of the signal displayed on the oscilloscope 43.

An inspection electrode of the second semiconductor substrate 20 may also have the same structure as the inspection electrode 22 of the first semiconductor substrate 10. At this time, like the first semiconductor substrate 10, inspection for the second semiconductor substrate 20 is performed using the probe needle 41. Therefore, description of the structure of the inspection electrode of the second semiconductor substrate 20 is omitted. The inspection is to perform electrical inspection by contacting the probe needle to the inspection electrode in a wafer state. In the present embodiment, as an example, the inspection with respect to the first semiconductor substrate 10 is inspection for verifying an operation of the pixel array included in the first semiconductor substrate 10. Further, as an example, the inspection with respect to the second semiconductor substrate 20 is inspection for verifying an operation of a logic circuit included in the second semiconductor substrate 20.

Figure 6:
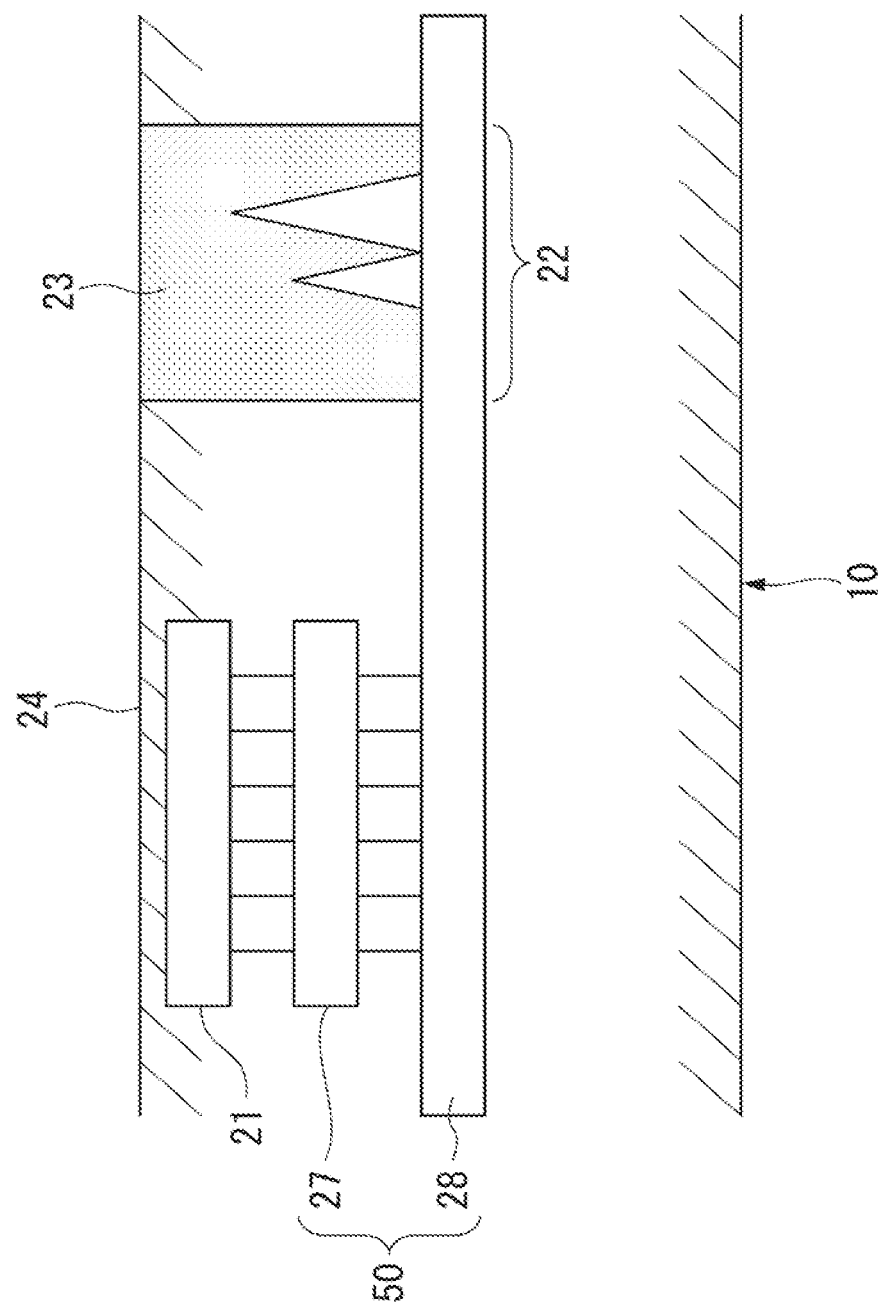
FIG. 6 is an example of a cross-sectional view of an inspection electrode of the first semiconductor substrate after a first opening is filled with filler.

FIG. 6 is a cross-sectional view of the inspection electrode 22 of the first semiconductor substrate 10 after the first opening 25 is filled with filler 23. In FIG. 6, the first opening 25 is filled with the filler 23. In this way, after the probe needle 41 is pressed to the inspection electrode 22, the first opening 25 is filled with the filler 23. As the filler 23, for example, an insulating resin or a silicon oxide layer can be used.

As described later, after the first semiconductor wafer 1 and the second semiconductor wafer 2 are connected, the probe needle 41 is pressed to a surface of the inspection electrode 22, which is used in the inspection of the first semiconductor wafer 1 before the semiconductor wafers are connected, opposite the surface thereof to which the probe needle 41 is pressed before the semiconductor wafers are connected. By pressing the needle twice, damage such as deformation or disconnection of the wiring layer of the inspection electrode 22 may be caused and may deteriorate electrical characteristics. As illustrated in FIG. 6, since the filler 23 is filled in the first opening 25 before the semiconductor wafers are connected, the deformation or damage of the wiring layer which may be caused when the probe needle 41 is pressed to the surfaces of both sides of the same electrode can be prevented.

Figure 7:
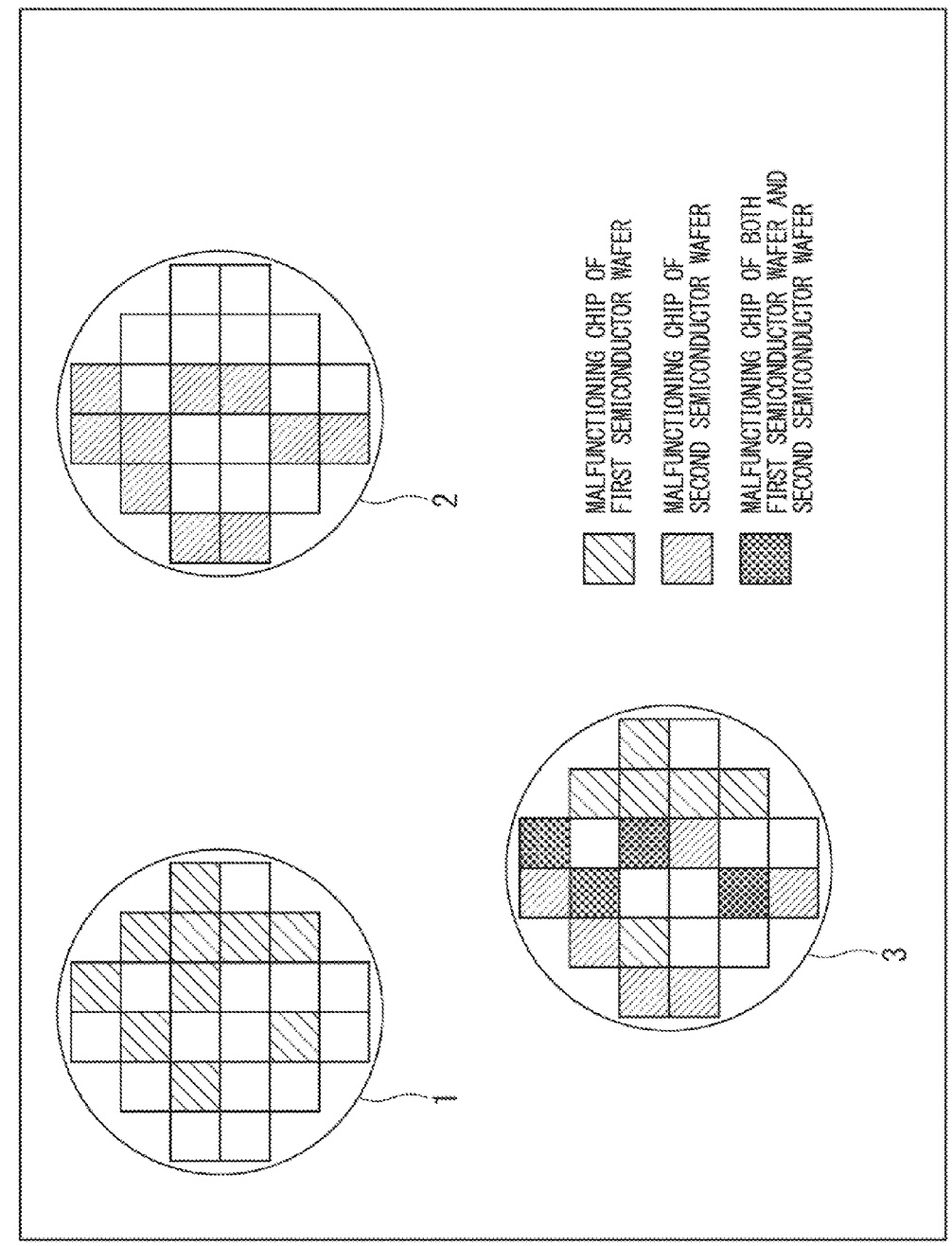
FIG. 7 is a view for describing a malfunctioning chip of a first semiconductor wafer, a second semiconductor wafer, and a connection wafer in which the first and second wafers are connected.

FIG. 7 is a view for describing malfunctioning chips (semiconductor substrates) of the first semiconductor wafer 1, the second semiconductor wafer 2, and a connection wafer 3 in which the first semiconductor wafer 1 and the second semiconductor wafer 2 are connected. In FIG. 7, each of regions enclosed in a box in the first semiconductor wafer 1, the second semiconductor wafer 2, and the connection wafer 3 corresponds to an imaging unit. In FIG. 7, in the first semiconductor wafer 1, malfunctioning chips of the first semiconductor wafer 1 are illustrated. In the second semiconductor wafer 2, malfunctioning chips of the second semiconductor wafer 2 are illustrated. In the connection wafer 3, the malfunctioning chips of the first semiconductor wafer 1, the malfunctioning chips of the second semiconductor wafer 2, and malfunctioning chips of both the first semiconductor wafer 1 and the second semiconductor wafer 2 are illustrated. The manufacturer extracts a combination of the first semiconductor wafer 1 and the second semiconductor wafer 2 in which the number of connections between operating chips is the largest. Accordingly, the manufacturer can reduce the number of malfunctioning chips in the connection wafer 3.

Figure 8:
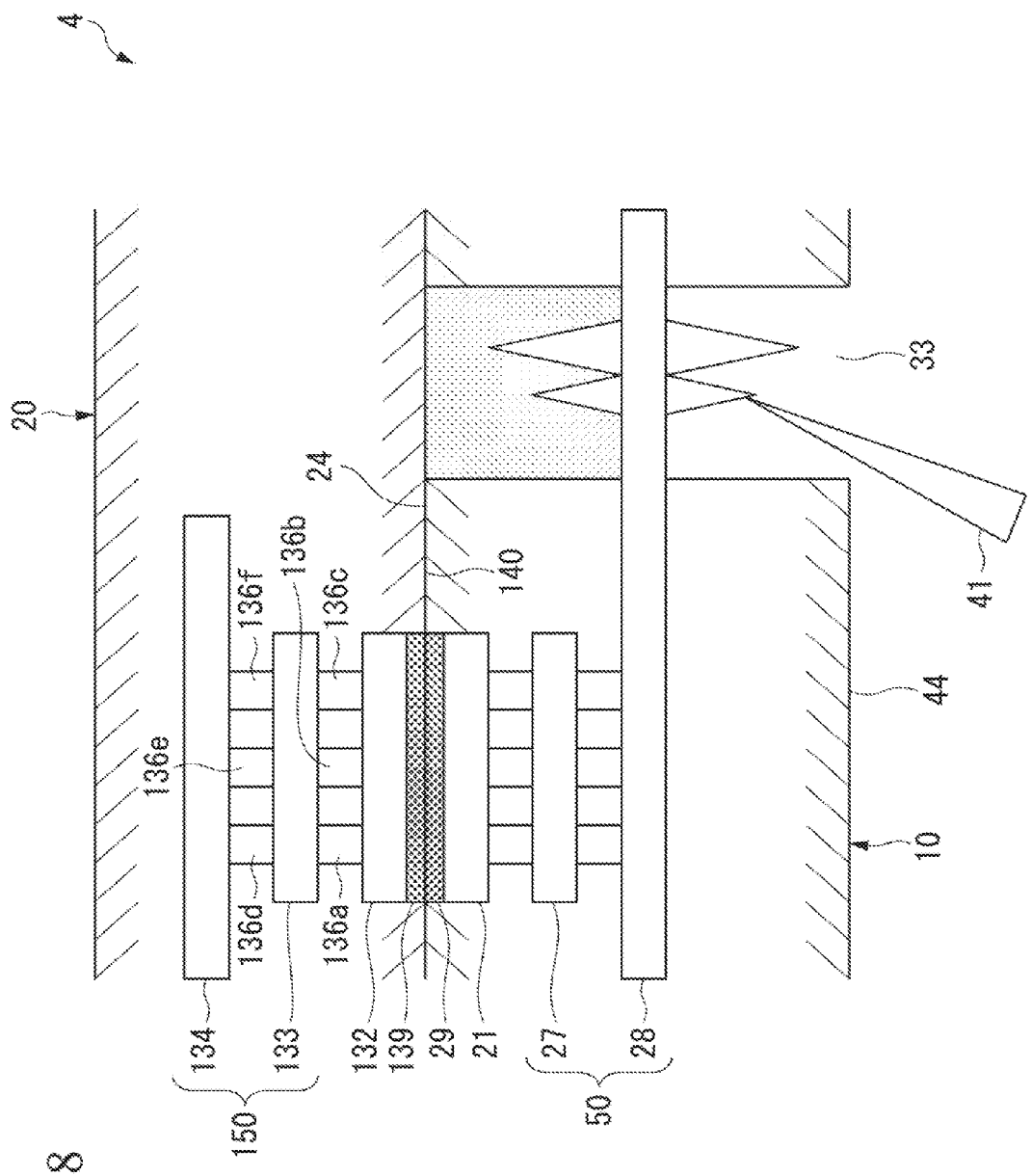
FIG. 8 is an example of a cross-sectional view of the semiconductor device according to the first embodiment of the present invention.

When inspection of the connection wafer 3 is performed, as illustrated in FIG. 8, a second opening 33 is formed by shaving a surface (a second surface) 44 on an opposite side of the connection surface 24 of the first semiconductor substrate 10 after the first semiconductor wafer 1 and the second semiconductor wafer 2 are connected. Thus, the inspection electrode 22 of the first semiconductor substrate 10 is exposed to enable the inspection of the connection wafer 3. By forming the second opening 33 just before the inspection, since a foreign substance should be prevented from entering the second opening 33 as much as possible, the second opening 33 is formed after the first semiconductor wafer 1 and the second semiconductor wafer 2 are connected.

FIG. 8 is an example of a cross-sectional view of the second opening 33 of the semiconductor device 4. In FIG. 8, the connection surface 24 of the first semiconductor substrate 10 and a connection surface (a second connection surface) 140 of the second semiconductor substrate 20 face each other. In the illustrated state, the first semiconductor substrate 10 and the second semiconductor substrate 20 are electrically connected to each other. In the semiconductor device 4 according to the present embodiment, as an example, the connection pad 21 included in the first semiconductor substrate 10 and the pad 132 included in the second semiconductor substrate 20 are electrically connected to each other through a first gold-plated part 29 and a second gold-plated part 139. Surfaces of the connection pad 21 and the pad 132 are exposed by etching before the connection. Gold is coated on the respective exposed surfaces of the connection pad 21 and the pad 132. Thus, as illustrated in FIG. 8, the first gold-plated part 29 and the second gold-plated part 139 are formed, respectively.

The second semiconductor substrate 20 has a wiring layer (a second wiring layer) 150. In the second semiconductor substrate 20, as an example, the wiring layer 150 has a third wiring 133 and a fourth wiring 134. The fourth wiring 134 is disposed in a different layer from the third wiring 133. The second semiconductor substrate 20 includes the second gold-plated part 139, the pad 132, the third wiring 133, the fourth wiring 134, and vias 136a to 136f in the inside thereof. The third wiring 133 is electrically and physically connected to the pad 132 by the vias 136a to 136c. The fourth wiring 134 is electrically and physically connected to the third wiring 133 by the vias 136d to 136f. For example, the fourth wiring 134 is connected to the read-out circuit 131 (not shown). The fourth wiring 134 receives a time-series signal acquired through read-out of the read-out circuit 131. The time-series signal is one signal in which an imaging signal of each pixel of the pixel region 111 is sequentially arranged.

The second opening 33 is formed in a connection surface in which the first semiconductor substrate 10 and the second semiconductor substrate 20 are connected, that is, a surface 44 opposite the connection surface 24. As an example, a horizontal location of the second opening 33 is the same as the horizontal location of the first opening 25. Here, the horizontal location is a location in a 2D coordinate parallel to the first semiconductor substrate 10. In FIG. 8, the probe needle 41 is pressed to a surface of the first inspection electrode 22 opposite the surface thereof to which the probe needle 41 is pressed before the first semiconductor substrate 10 is connected to the second semiconductor substrate 20.

In the semiconductor device 4 according to the present embodiment, as an example, the manufacturer forms an opening exposing an electrode configured to input a voltage supplied from a power source to the semiconductor device 4, in the semiconductor device 4 in the same surface as the second opening 33 formed in the semiconductor device 4. For example, the manufacturer forms an opening exposing an electrode configured to input an electrical signal supplied from a pulse generator to the semiconductor device 4, in the semiconductor device 4 in the same surface as the second opening 33 formed in the semiconductor device 4.

A power source (not shown) supplies a voltage (for example, a power voltage for the read-out circuit 131) to one semiconductor device 4 in the connection wafer 3. A pulse generator (not shown) supplies an electrical signal (for example, a clock signal for driving the read-out circuit 131) to the semiconductor device 4 in the connection wafer 3. At this time, the time-series signal read out from the read-out circuit 131 reaches the inspection electrode 22 through the fourth wiring 134, the third wiring 133, the pad 132, the connection pad 21, the second wiring 27, and the first wiring 28. At this time, the manufacturer presses the probe needle 41 to the inspection electrode 22 in the second opening 33. Thus, the probe needle 41 detects the time-series signal acquired through the read-out of the read-out circuit 131. For example, the probe needle 41 outputs the detected time-series signal to the oscilloscope (not shown). The oscilloscope displays a waveform of the time-series signal. The manufacturer checks the waveform of the time-series signal displayed on the oscilloscope. Thus, the manufacturer may check whether or not the entire operation of the semiconductor device 4 is normal.

Figure 9:
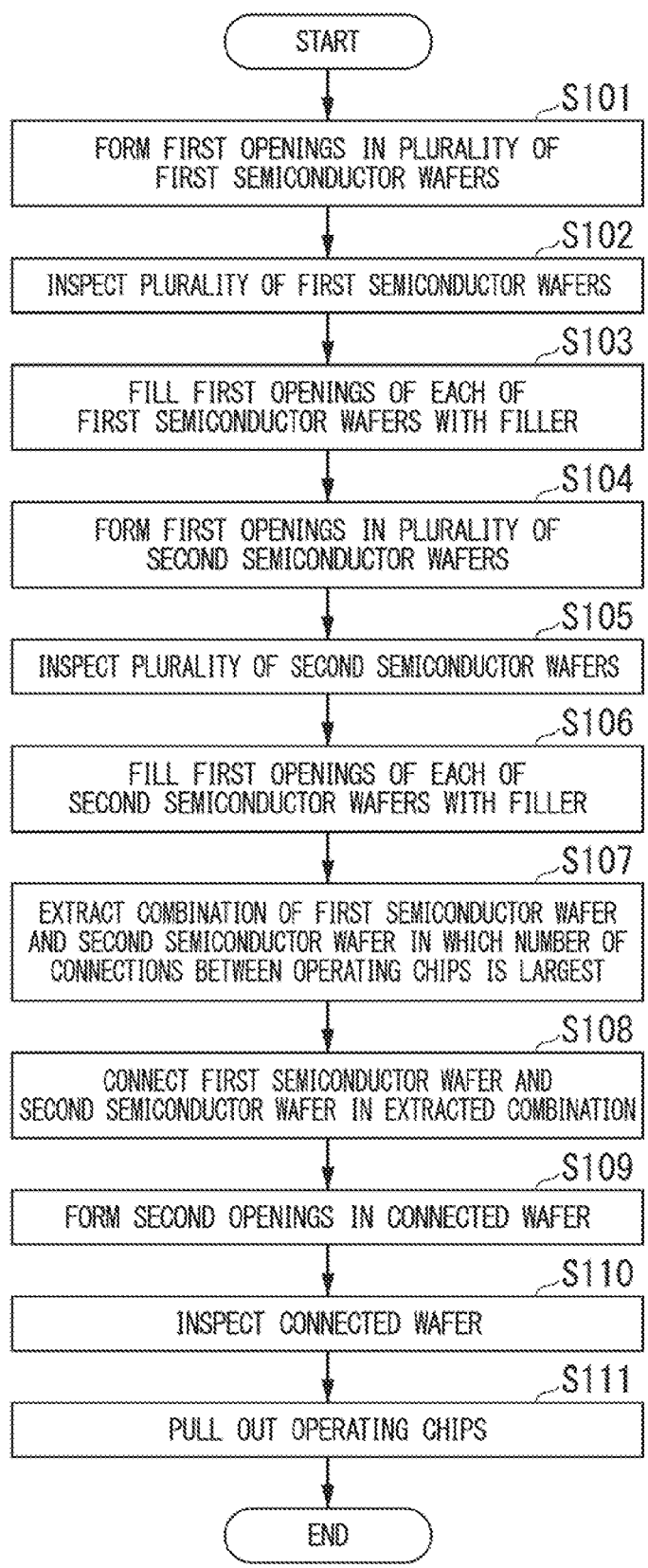
FIG. 9 is a flowchart illustrating an example of a flow of fabrication of the semiconductor device according to the first embodiment of the present invention.

Next, flow of fabrication of the semiconductor device 4 according to the first embodiment is described. FIG. 9 is a flowchart illustrating an example of flow of fabrication of the semiconductor device 4 according to the first embodiment.

The manufacturer forms the first openings 25 in each of a plurality of first semiconductor wafers (step S101). The manufacturer inspects the plurality of first semiconductor wafers 1 to select operating chips and non-operating chips by pressing the probe needle 41 to the first openings 25 formed in each of the plurality of first semiconductor wafers 1 (step S102). The manufacturer fills the filler 23 in the first openings 25 formed in each of the plurality of first semiconductor wafers 1 (step S103). The manufacturer forms the first openings 25 in each of a plurality of second semiconductor wafers 2 (step S104). The manufacturer inspects the plurality of second semiconductor wafers 2 to select operating chips and non-operating chips by pressing the probe needle 41 to the first openings 25 formed in each of the plurality of second semiconductor wafers 2 (step S105). The manufacturer fills the filler 23 in the first openings 25 formed in each of the plurality of second semiconductor wafer 2 (step S106).

At a point of time before each of the first semiconductor wafers 1 and each of the second semiconductor wafers 2 are connected, locations of operating chips in the plurality of first semiconductor wafers 1 and the plurality of second semiconductor wafers 2 are determined. The manufacturer then extracts a combination of the first semiconductor wafer 1 and the second semiconductor wafer 2 whereby the number of connections between operating chips is the largest (step S107). The manufacturer connect the first semiconductor wafer 1 and the second semiconductor wafer 2 on the basis of the extracted combination so that the first semiconductor wafer 1 and the second semiconductor wafer 2 are electrically connected to each other in connection parts included therein in a state in which wiring layer sides of the wafers face each other (step S108). In this way, yield is improved by forming the connection wafer 3 by connecting the pair of the first semiconductor wafer 1 and the second semiconductor wafer 2 such that the number of connections between operating chips is the largest. The manufacturer forms the second openings 33 in the connection wafer 3 (step S109). The manufacturer inspects the connection wafer 3 to select operating chips and non-operating chips by pressing the probe needle 41 to the second openings 33 formed in the connection wafer 3 (step S110). The manufacturer pulls out the operating chip from the connection wafer 3 as the semiconductor device 4 (step S111). At this point, the process of the flowchart is completed.

In the above first embodiment, the semiconductor device 4 is formed by inspecting the first semiconductor substrate 10 and the second semiconductor substrate 20 in a wafer state, and then electrically connecting the first semiconductor substrate 10 and the second semiconductor substrate 20 in the connection units included therein in a state in which the wiring layer sides of the wafers face each other.

Conventionally, in the inspection of the operation of the wafer, the probe needle is pressed to the electrode formed on the wafer surface. Thus, an impression made by the probe needle remains in the electrode after the inspection. The impression of the probe needle rises to a height of about several micrometers, which is substantially the same as a bump, and thus portions which are inherently electrically conductive may not be conductive when the wafers are connected.

For example, in FIG. 13, seven connection electrodes 120 and two pads 131 are illustrated in a third semiconductor wafer 121. Inspection of an operation of the third semiconductor wafer 121 is performed by applying a probe needle 122a and a probe needle 122b to the pads 131. At this time, in the third semiconductor wafer 121, the impression 123 is formed in each of the pads 131. The impression of the probe needle rises to a height of about several micrometers, which is substantially the same as a bump.

In the semiconductor device 4 according to the first embodiment, the first semiconductor substrate 10 and the second semiconductor substrate 20 have wiring layers 50 and 150 in which wirings are disposed in a plurality of layers, respectively. The first semiconductor substrate 10 has the first opening 25 in the connection surface 24 connected to the second semiconductor substrate 20. The inspection electrode 22, which is electrically connected to a portion of a wiring included in the wiring layer 50 and electrically connectable to the outside, is formed in the inside of the first opening 25. Thus, an impression of the probe needle 41 does not protrude from the surface of the first semiconductor substrate 10. Accordingly, it is possible to prevent the impression from interfering with electrical connection between the wafers so that good electrical connection can be made.

In the present embodiment, the first semiconductor substrate 10 has the first opening 25 in the connection surface 24 connected to the second semiconductor substrate 20. The second semiconductor substrate 20 has the first opening 25 in the connection surface 140 connected to the first semiconductor substrate 10. However, the configurations of the semiconductor substrates are not limited thereto. Only a semiconductor substrate which is an inspection target may have the first opening 25. From this, at least one of the first semiconductor substrate 10 and the second semiconductor substrate 20 may have the first opening 25 in a connection surface connected to the other semiconductor substrate.

In the present embodiment, the first semiconductor substrate 10 and the second semiconductor substrate 20 have a plurality of openings (concave portions) for a driving voltage or an input signal of the circuit in the wiring layer sides of both the first semiconductor substrate 10 and the second semiconductor substrate 20. Thus, even when an impression of the probe needle is formed in the electrode formed in each of the plurality of openings, it is possible to prevent the impression from interfering with electrical connection between the wafers so that good electrical connection can be made.

In the present embodiment, the plurality of openings (concave portions) are provided in the wiring layer sides of both the first semiconductor substrate 10 and the second semiconductor substrate 20. However, the configurations of the semiconductor substrates are not limited thereto. At least one of the wiring layer side of the first semiconductor substrate 10 and the wiring layer side of the second semiconductor substrate 20 may have the plurality of openings.

In the present embodiment, the first semiconductor substrate 10 has openings (concave portions) in both surfaces thereof. Thus, it is possible to check operations of the first semiconductor substrate 10 before connection and the first semiconductor substrate 10 after connection.

In the present embodiment, the second opening 33 is provided in the same horizontal location as the first opening 25. The first opening 25 exposes one surface of the inspection electrode 22. The second opening 33 exposes the inspection electrode 22 in a surface opposite the surface exposed by the first opening 25. Filler is filled in the inside of the first opening 25 formed in the wiring layer side of the first semiconductor substrate 10. After inspection of the first semiconductor substrate 10, the filler is filled before the first semiconductor substrate 10 and the second semiconductor substrate 20 are connected. Thus, mechanical strength of the first wiring 28 is improved by filling the filler. Accordingly, even when the probe needle 41 is pressed to a surface of the inspection electrode 22, which is disposed in the inside of the second opening 33 provided in the same horizontal location as the first opening 25, opposite the surface thereof to which the probe needle 41 is pressed before the connection, damage such as deformation or disconnection of the wiring layer of the inspection electrode 22 can be prevented.

In the present embodiment, the second opening 33 is provided in the same horizontal location as the first opening 25. However, the horizontal location of the second opening 33 may be different from that of the first opening 25. For example, an opening range of the first opening in the 2D coordinate parallel to the first semiconductor substrate 10 and an opening range of the second opening 33 in the 2D coordinate may at least partially overlap. Openings may be provided in both surfaces of the second semiconductor substrate 20 as well as the first semiconductor substrate 10. At this time, horizontal locations of the first opening 25 and the second opening 33 may be the same or different.

In the present embodiment, as an example, it has been described that one inspection electrode is provided. However, the same inspection electrode may be provided in plural in at least one of the first semiconductor substrate 10 and the second semiconductor substrate 20.

In the present embodiment, after the first opening 25 is provided in both the first semiconductor substrate 10 and the second semiconductor substrate 20 and inspection of both the first semiconductor substrate 10 and the second semiconductor substrate 20 in a wafer state is performed, the first semiconductor substrate 10 and the second semiconductor substrate 20 are connected to each other. However, the connection between the semiconductor substrates is not limited thereto. The first opening 25 may be provided in at least one of the first semiconductor substrate 10 and the second semiconductor substrate 20, and the semiconductor device in which the first opening 25 may be provided is inspected in the wafer state. Then, the first semiconductor substrate 10 and the second semiconductor substrate 20 may be connected to each other.

The semiconductor device 4 serving as an image sensor may be a solid-state image sensor in which the first semiconductor substrate 10 formed with at least a pixel array, and the second semiconductor substrate 20 formed with at least a logic circuit configured to read out a signal acquired in the pixel array, are connected.

In the present embodiment, as an example, it has been described that the semiconductor device 4 functions as an image sensor. However, the function of the semiconductor device 4 is not limited thereto.

In the present embodiment, the second opening 33 is provided in the first semiconductor substrate 10. However, the second opening 33 may be provided in the second semiconductor substrate 20. At this time, the entire operation of the semiconductor device 4 may be checked by pressing the probe needle 41 to the electrode in the second opening 33 formed in the second semiconductor substrate 20.

First Modified Example

Figure 10:
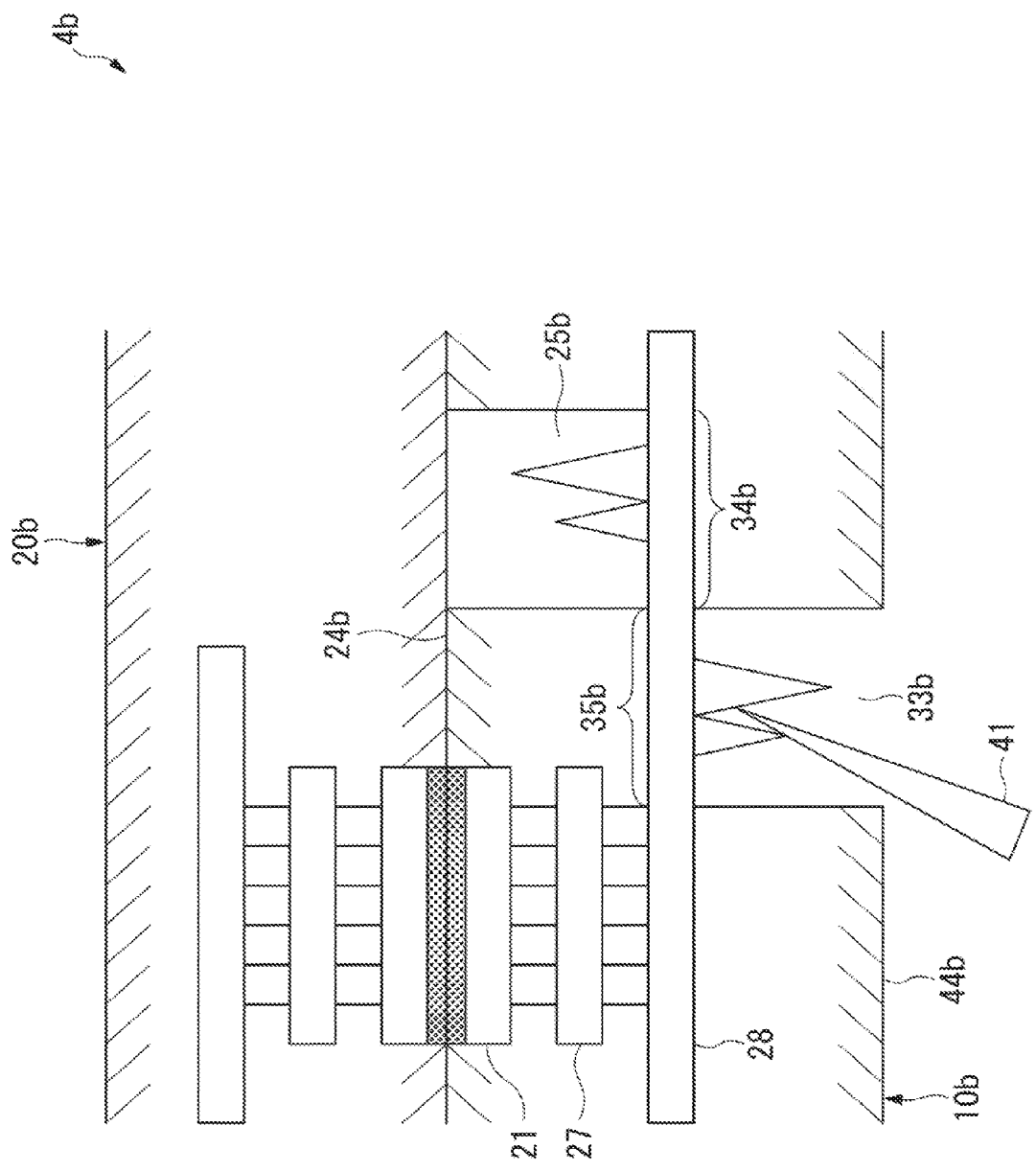
FIG. 10 is an example of a cross-sectional view of a semiconductor device according to a first modified example of the semiconductor device according to the first embodiment of the present invention.

Next, a first modified example is described. FIG. 10 is an example of a cross-sectional view of a semiconductor device 4b according to a first modified example. In FIG. 10, the semiconductor device 4b in which a first semiconductor substrate 10b and a second semiconductor substrate 20b are connected is illustrated. In FIG. 10, a first opening (a concave portion) 25b is formed in a connection surface (a first connection surface or a first surface) 24b of the first semiconductor substrate 10b. A second opening (a concave portion) 33b is formed in a surface (a second surface) 44b opposite the connection surface 24b of the first semiconductor substrate 10b. A first inspection electrode (a first electrode) 34b is exposed within the first opening 25b by removing silicon in the first semiconductor substrate 10b up to the first wiring 28. For example, the manufacturer removes silicon in the first semiconductor substrate 10b up to the first wiring 28 to expose a second inspection electrode (a second electrode) 35b within the second opening 33b.

The semiconductor device 4b illustrated in FIG. 10 is different from the semiconductor device 4 illustrated in FIG. 8 in the following two ways. Firstly, horizontal locations of the first opening 25b and the second opening 33b are different, and an opening range of the first opening 25b in a plane parallel to the first semiconductor substrate 10b does not overlap an opening range of the second opening 33b in the plane. Secondly, the first opening 25b is not filled with filler 23. In the semiconductor device 4b, even when the first opening 25b is not filled with the filler 23, since a horizontal location of the first wiring 28 to which the probe needle 41 is pressed is different, damage such as deformation or disconnection of the first wiring 28 can be prevented.

In FIG. 10, the second opening 33b may be formed before the probe needle 41 is pressed to the first inspection electrode 34b within the first opening 25b. An opening range of the first opening 25b in a 2D coordinate parallel to the first semiconductor substrate 10b does not overlap an opening range of the second opening 33b in the 2D coordinate. Therefore, a location in which the probe needle 41 is pressed to the first inspection electrode 34b is different from a location in which the probe needle 41 is pressed to the second inspection electrode 35b. Even when the probe needle 41 is pressed to the second inspection electrode 35b provided in the second opening 33b, damage such as deformation or disconnection of the second inspection electrode 35b can be prevented.

In the present modified example, as an example, the opening range of the first opening 25b in the 2D coordinate parallel to the first semiconductor substrate 10b does not overlap the opening range of the second opening 33b in the 2D coordinate. However, the opening range of the first opening 25b may partially overlap the opening range of the second opening 33b. That is, only at least a center location of the opening range of the first opening 25b in the 2D coordinate parallel to the first semiconductor substrate 10b and a center location of the opening range of the second opening 33b in the 2D coordinate may be different.

In the first modified example, the first semiconductor substrate 10b has openings (concave portions) in both surfaces thereof. An opening of one of the two surfaces is formed at a different horizontal location from an opening of the other of the two surfaces. An electrode formed in the inside of the opening of the one surface is electrically connected to the same wiring as a wiring to which an electrode formed in the inside of the opening in the other surface is connected. Thus, even when the probe needle 41 is pressed to the second inspection electrode 35b provided in the second opening 33b, since the location to the second inspection electrode 35b is different to a location at which the probe needle 41 is pressed before the first semiconductor substrate 10b and the second semiconductor substrate 20b are connected, damage such as deformation or disconnection of the second inspection electrode 35b can be prevented. The second semiconductor substrate 20 may have openings in both surfaces.

Second Modified Example

Figure 11:
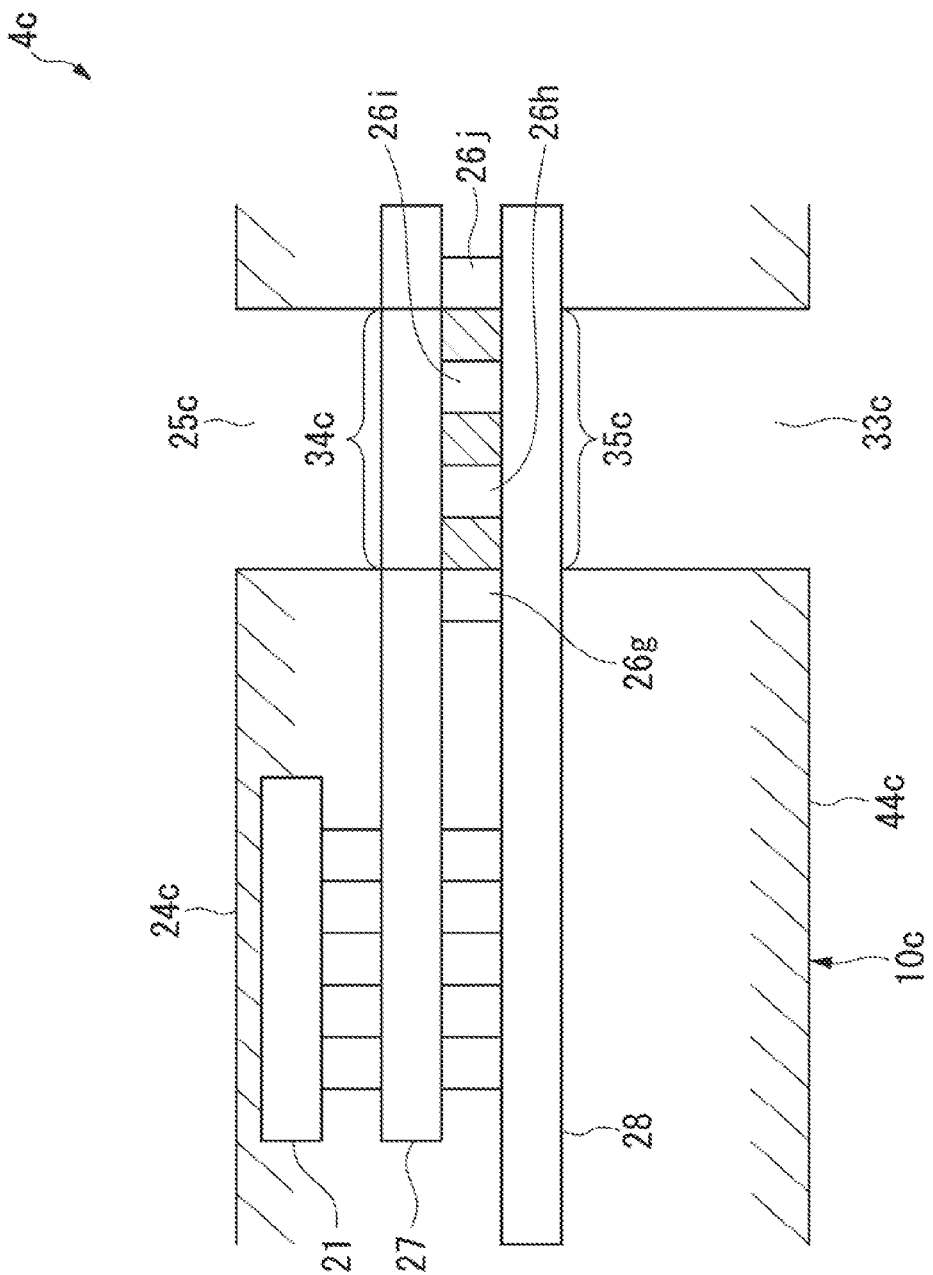
FIG. 11 is an example of a cross-sectional view of a semiconductor device according to a second modified example of the semiconductor device according to the first embodiment of the present invention.

Next, a second modified example is described. FIG. 11 is an example of a cross-sectional view of a semiconductor device 4c according to a second modified example. In FIG. 11, a first semiconductor substrate 10c of the semiconductor device 4c in which the first semiconductor substrate 10c and a second semiconductor substrate are connected is illustrated. In FIG. 11, a first opening (a concave portion) 25c is formed in a connection surface (a first connection surface or a first surface) 24c of the first semiconductor substrate 10c. A second opening (a concave portion) 33c is formed in a surface (a second surface) 44c opposite the connection surface 24c of the first semiconductor substrate 10c. A first inspection electrode (a first electrode) 34c is exposed within the first opening 25c by removing silicon in the first semiconductor substrate 10c up to the second wiring 27. A second inspection electrode (a second electrode) 35c is exposed within the second opening 33c by removing silicon in the first semiconductor substrate 10c up to the first wiring 28. A center location of an opening range of the first opening 25c in a plane parallel to the first semiconductor substrate 10c and a center location of an opening range of the second opening 33c in the plane are the same.

Compared to FIG. 8, vias 26g to 26j are newly inserted between the first wiring 28 and the second wiring 27. Silicon is filled between the via 26g and the via 26h, between the via 26h and the via 26i, and between the via 26i and the via 26j. Since the vias 26g to 26j are inserted between the first inspection electrode 34c and the second inspection electrode 35c, strength can be further improved compared to when the spaces are filled with only silicon. The first inspection electrode 34c and the second inspection electrode 35c are connected through the vias 26g to 26j, which are conductive, at a location close to each other. Therefore, resistance between the first inspection electrode 34c and the second inspection electrode 35c can be reduced to improve electrical characteristics.

In the second modified example, the first semiconductor substrate 10c or the second semiconductor substrate has openings (concave portions) in both surfaces. An electrode formed in the inside of the opening of one of the two surfaces is electrically connected to a wiring of a different layer from a wiring to which an electrode formed in the inside of the opening in the other of the two surfaces is electrically connected. The wirings are electrically connected to each other. Thus, since a probe needle is pressed into the wiring in the different layer, damage such as deformation or disconnection of the wiring can be prevented.

In the semiconductor substrate having openings in both surfaces, the opening of one of the two surfaces is formed in the same horizontal location as the opening of the other of the two surfaces. The electrode formed in the inside of the opening of one of the two surfaces is formed in the same horizontal location as the electrode formed in the inside of the opening of the other of the two surfaces. Wirings of the electrodes are connected by the vias. Thus, even when the electrodes are formed in the wirings of the different layers in the same horizontal location, mechanical strength of the electrodes is improved by connecting the electrodes by vias. Therefore, even when a probe needle is pressed to each of the electrodes, damage such as deformation or disconnection of the wiring can be prevented. Further, since the vias are conductive, resistance between the electrodes can be reduced to improve electrical characteristics.

The second semiconductor substrate may have openings in both surfaces with the same configuration as the first semiconductor substrate 10c.

In the first embodiment, the first modified example, and the second modified example, it has been described that two-layered wiring layers are used. However, the wiring layer may be a single layer or three or more layers.

Second Embodiment

In a second embodiment of the present invention, an imaging device 100 having the semiconductor device 4 which has been described in the first embodiment as an image sensor is described.

Figure 12:
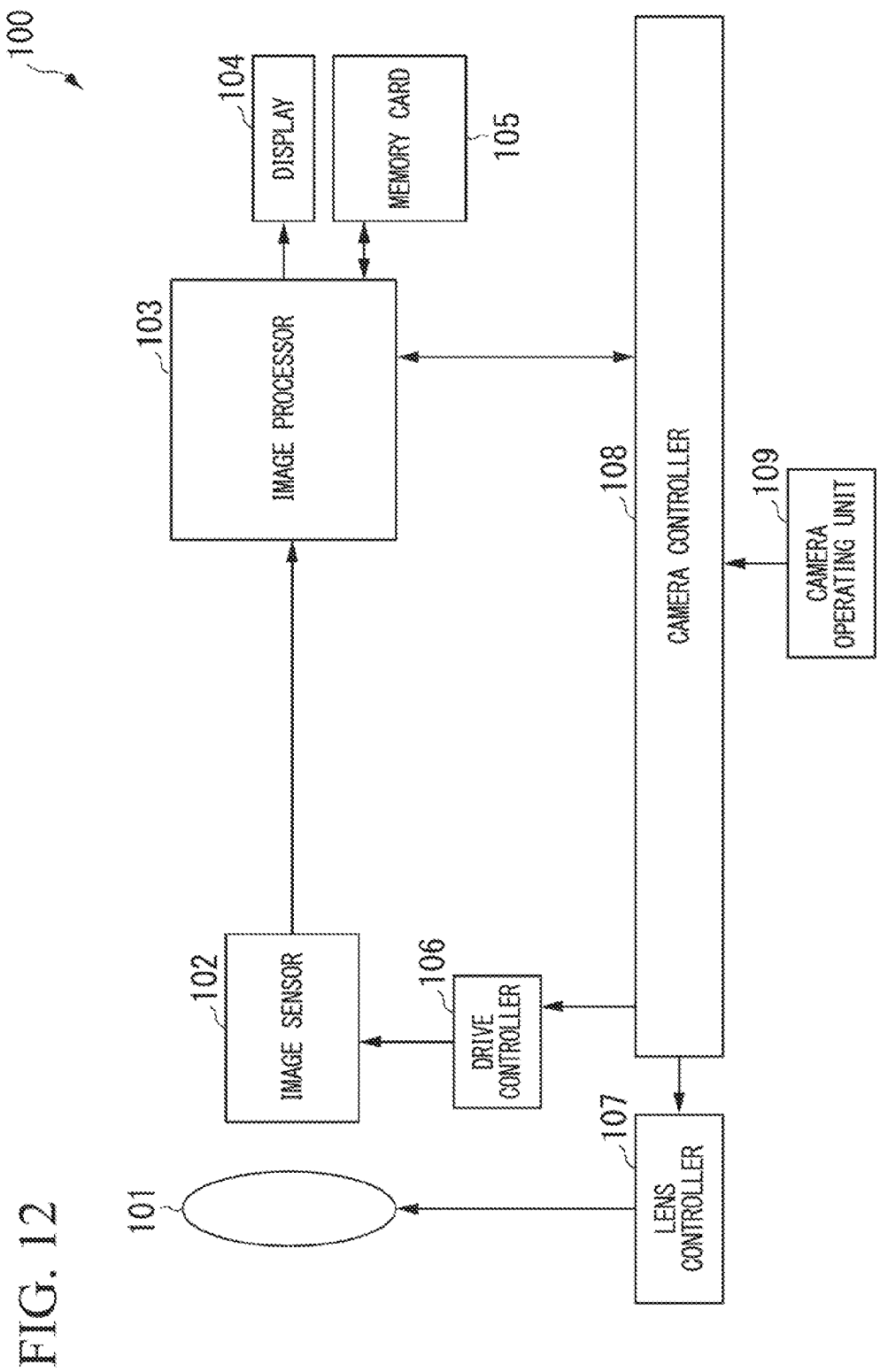
FIG. 12 is a schematic block diagram illustrating a configuration of an imaging device according to a second embodiment of the present invention.

FIG. 12 is a schematic block diagram illustrating a configuration of the imaging device 100 according to the present embodiment. The imaging device 100 includes a lens 101, an image sensor (an imaging unit) 102, an image processor 103, a display 104, a memory card 105, a drive controller 106, a lens controller 107, a camera controller 108, and a camera operating unit 109. FIG. 12 illustrates a configuration in which the imaging device 100 includes the memory card 105. However, since the memory card 105 can be attached to and detached from the imaging device 100, the memory card 105 may not be a unique configuration in the imaging device 100.

The lens 101 is an imaging lens configured to form an optical image of a subject on an imaging surface of the image sensor 102. The image sensor 102 images the subject by converting light collected by the lens 101 into an electrical signal. The image sensor 102 photoelectric-converts the optical image of the subject formed by the lens 101 into a digital image signal. The image sensor 102 outputs the converted image signal to the image processor 103.

The image processor 103 performs various digital image-processing operations (for example, noise removal and the like) on the image signal output from the image sensor 102. The image processor 103 generates a display signal image-processed for display and outputs the generated display signal to the display 104. The image processor 103 generates recording image information image-processed for record and stores the generated recording image information in the memory card 105. The memory card 105 retains the recording image information stored by the image processor 103. The memory card 105 may include a recording medium.

The display 104 displays an image based on the display signal input from the image processor 103. For example, the display 104 may perform a live view (LV) display for displaying a range to be imaged in real time as well as reproduce and display a still image.

The drive controller 106 controls an operation of the image sensor 102 based on a command from the camera controller 108. The lens controller 107 controls an aperture of a lens and a focal point based on the command from the camera controller 108. The camera controller 108 controls the entire imaging device 100. The camera operating unit 109 performs various operation inputs with respect to the imaging device 100. The camera operating unit 109 includes, for example, a power switch configured to turn on/off power of the imaging device, a release button configured to introduce still image shooting, and a still image shooting mode switch configured to switch a still image shooting mode into a single shooting mode and a continuous shooting mode.

In the second embodiment, the image sensor 102 is a solid-state image sensor in which a first semiconductor substrate 10 formed with at least a pixel array and a second semiconductor substrate 20 formed with at least a logic circuit are connected. The imaging device 100 includes the image sensor 102 as an imaging unit configured to image a subject. Thus, since electrical connection of the first semiconductor substrate 10 and the second semiconductor substrate 20 is good, the image sensor 102 having good electrical connection can be provided. The imaging device (for example, a digital camera or an endoscope) 100 using the image sensor 102 can be provided.

While preferred embodiments of the present invention have been described and illustrated above, the present invention is not limited to the embodiments. Additions, omissions, substitutions, and other modifications can be made to the present invention without departing from the spirit and scope of the present invention. The present invention is not limited to the foregoing description, and is only limited by the appended claims.

What is claimed is:

1. A semiconductor device comprising:
    a first semiconductor substrate having a first wiring layer in which wirings are disposed in a plurality of layers; and
    a second semiconductor substrate having a second wiring layer in which wirings are disposed in a plurality of layers, wherein
    in a state in which a first connection surface of the first semiconductor substrate and a second connection surface of the second semiconductor substrate face each other, the first semiconductor substrate and the second semiconductor substrate are electrically connected to each other,
    a first concave portion is formed in the first connection surface, the first concave portion having a first side surface and a first bottom surface,
    a first electrode is formed in the first semiconductor substrate, the first electrode being electrically connected to the first wiring layer, the first electrode being exposed at the first bottom surface, and
    the first concave portion is filled with a filler so as to cover the first side surface and the first bottom surface, the filler being insulating material.

2. The semiconductor device according to claim 1, wherein the first semiconductor substrate further comprising:
    a second concave portion formed in a surface being opposite to the first surface, the second concave portion having a second side surface and a second bottom surface; and
    a second electrode formed in the first semiconductor substrate, the second electrode being electrically connected to the first wiring layer, the second electrode being exposed at the second bottom surface.

3. The semiconductor device according to claim 2, wherein an opening range of the first concave portion in a two-dimensional plane parallel to the first connection surface at least partially overlaps an opening range of the second concave portion in the two-dimensional plane.

4. The semiconductor device according to claim 1, wherein the first semiconductor substrate is inspected using the first electrode before the first concave portion is filled with the filler, and
    after the first concave portion is filled with the filler, the first semiconductor substrate and the second semiconductor substrate are electrically connected to each other.

5. The semiconductor device according to claim 2, wherein an opening range of the first concave portion in a two-dimensional plane parallel to the first connection surface does not overlap an opening range of the second concave portion in the two-dimensional plane, and
    the first electrode and the second electrode are directly connected to each other.

6. The semiconductor device according to claim 3, wherein the first electrode is electrically connected to one of the first wiring layer,
the second electrode is electrically connected to another of the first wiring layer, and
the first electrode and the second electrode are directly connected to each other.

7. The semiconductor device according to claim 1, wherein
at least one pixel array is formed in one of the first semiconductor substrate and the second semiconductor substrate, and
at least a logic circuit configured to read out a signal acquired by the pixel array is formed in another of the first semiconductor substrate and the second semiconductor substrate.

8. An imaging device comprising the semiconductor device according to claim 7 as an imaging unit configured to image a subject.

9. A method of inspecting a semiconductor substrate, which is used for inspecting a first semiconductor substrate, which has a first wiring layer in which wirings are disposed in a plurality of layers, used in a semiconductor device in which the first semiconductor substrate and a second semiconductor substrate are electrically connected to each other in a state in which a first connection surface of the first semiconductor substrate and a second connection surface of the second semiconductor substrate face each other, the method comprising:
a process of inspecting the first semiconductor substrate in which the first connection surface has a concave portion which has an electrode electrically connected to a portion of a wiring included in the first wiring layer and capable of being electrically connected to an outside in an inside thereof, using an electrical signal acquired using a probe needle from the electrode; and
a process of filling the concave portion with a filler, the filler being insulating material.

10. A method of fabricating a semiconductor device, the method comprising:
a process of forming a concave portion in a first connection surface of at least a first semiconductor substrate of the first semiconductor substrate having a first wiring layer in which wirings are disposed in a plurality of layers and a second semiconductor substrate having a second wiring layer in which wirings are disposed in a plurality of layers, the concave portion having an electrode which is electrically connected to a portion of the wirings of the first semiconductor substrate and is capable of being electrically connected to an outside therein, the first connection surface being connected to the second semiconductor substrate;
a process of inspecting at least the first semiconductor substrate in which the concave portion is formed using an electrical signal acquired using a probe needle from the electrode in the inside of the concave portion in a wafer state;
a process of filling the concave portion with a filler, the filler being insulating material; and
a process of electrically connecting the first semiconductor substrate and the second semiconductor substrate to each other in a state in which the first connection surface of the first semiconductor substrate and a second connection surface of the second semiconductor substrate face each other.

* * * * *